US011560303B2

(12) United States Patent
Loeppert (10) Patent No.: US 11,560,303 B2
(45) Date of Patent: Jan. 24, 2023

(54) MEMS DEVICE WITH A DIAPHRAGM HAVING A NET COMPRESSIVE STRESS

(71) Applicant: Knowles Electronics, LLC, Itasca, IL (US)

(72) Inventor: Peter V. Loeppert, Durand, IL (US)

(73) Assignee: Knowles Electronics, LLC, Itasca, IL (US)

( * ) Notice: Subject to any disclaimer, the term of this patent is extended or adjusted under 35 U.S.C. 154(b) by 360 days.

(21) Appl. No.: 16/923,068

(22) Filed: Jul. 7, 2020

(65) Prior Publication Data

US 2022/0009770 A1    Jan. 13, 2022

(51) Int. Cl.
*B81B 7/00* (2006.01)
*B81C 1/00* (2006.01)
*H04R 19/00* (2006.01)

(52) U.S. Cl.
CPC ........ *B81C 1/00158* (2013.01); *B81B 7/0054* (2013.01); *H04R 19/005* (2013.01); *B81B 2201/0257* (2013.01)

(58) Field of Classification Search
CPC .............. B81C 1/00158; B81B 7/0054; B81B 2201/0257; H04R 19/005
See application file for complete search history.

(56) References Cited

U.S. PATENT DOCUMENTS

| | | | |
|---|---|---|---|
| 2007/0121972 A1* | 5/2007 | Suzuki ................. | H04R 19/005 381/174 |
| 2008/0123876 A1* | 5/2008 | Sato ..................... | H04R 19/016 381/174 |
| 2019/0116429 A1* | 4/2019 | Meisel .................. | H04R 19/04 |

\* cited by examiner

*Primary Examiner* — Samuel A Gebremariam
(74) *Attorney, Agent, or Firm* — Loppnow & Chapa; Matthew C. Loppnow (57) ABSTRACT

An implementation of a MEMS device includes a constrained diaphragm comprising a surface, the diaphragm having a net compressive stress; and a backplate comprising a surface facing the surface of the diaphragm, the surface of the backplate having a center, and a post extending from the surface of the backplate, wherein the post is located at or near a center of the surface and limits a maximum deflection of the diaphragm.

14 Claims, 8 Drawing Sheets

MEMS DEVICE WITH A DIAPHRAGM HAVING A NET COMPRESSIVE STRESS

BACKGROUND

It has generally been accepted that a micro-electromechanical systems (MEMS)-based acoustic sensor needs to have a diaphragm whose net stress is tensile. This is because a diaphragm having a net compressive stress will tend to buckle during operation.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

A constrained diaphragm is one in which the diaphragm is attached (e.g., to a substrate) such that the exposed edge of the diaphragm cannot move along the x, y, or z axes or rotate about any axis. Such a diaphragm eliminates the potential for contamination entering around the diaphragm edge but is very sensitive to residual film stress. It is well accepted that any residual film stress in a diaphragm should be tensile, because if it is compressive the diaphragm will buckle. However, the stiffness of the diaphragm in operation does not depend solely on its initial stress but rather on the induced stress and bow caused by the electrostatic field between the diaphragm and the backplate. Because the net diaphragm stress does not matter when the microphone is not in operation, it is thus possible to work with a diaphragm that has a net compressive film stress. Manufacturing a diaphragm with a net compressive stress is easier and less expensive than manufacturing one with a net tensile stress.

In general, disclosed herein are a MEMS device having a diaphragm with a net compressive stress and a microphone incorporating such a MEMS device. The details of will be more fully explained by reference to the figures.

According to an embodiment, a MEMS device includes a constrained diaphragm comprising a surface, the diaphragm having a net compressive stress; and a backplate comprising a surface facing the surface of the diaphragm, the surface of the backplate having a center; and a post extending from the surface of the backplate, wherein the post is located at or near the center, wherein the post limits a maximum deflection of the diaphragm.

In an embodiment, a MEMS device includes a constrained diaphragm comprising a surface, wherein the diaphragm has a net compressive stress; and a backplate comprising a surface facing the surface of the diaphragm, and a post extending from the surface of the backplate, wherein the post is disposed at or near an unconstrained maximum deflection point of the diaphragm so as to limit an actual maximum deflection of the diaphragm during operation of the MEMS device.

According to an embodiment, a microphone includes a MEMS device comprising a constrained diaphragm comprising a surface, wherein the diaphragm has a net compressive stress; an integrated circuit electrically connected to the MEMS device; and a backplate comprising a surface facing the surface of the diaphragm, and a post extending from the surface of the backplate, wherein the post is disposed at or near a centroid of the diaphragm and the backplate.

In an embodiment, the microphone further includes a housing comprising a base and a cover attached to the base, wherein the housing encloses the MEMS device and the integrated circuit. The housing may further comprise an acoustic port defined in either the cover or in the base.

According to an embodiment, the diaphragm (which may be attached to the post) comprises a plurality of film layers having a combined net compressive stress. For example, one or more of the layers may be compressive or tensile. The diaphragm may be made of a tensile nitride layer and a compressive polycrystalline silicon layer.

Figure 1A:
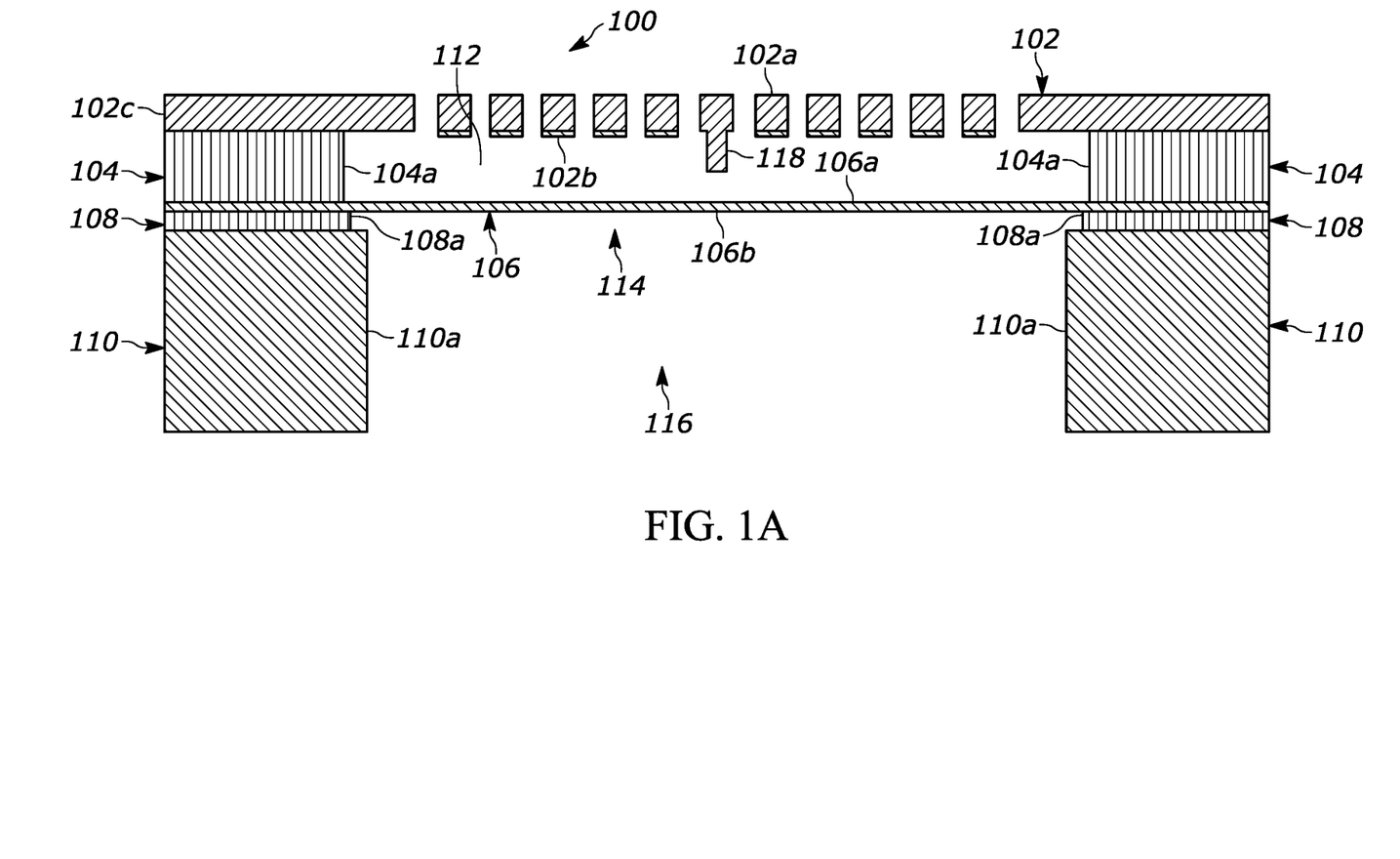
FIG. 1A is a side cross-sectional view of a MEMS device according to an embodiment, with the MEMS device in an unbiased state.
Figure 1B:
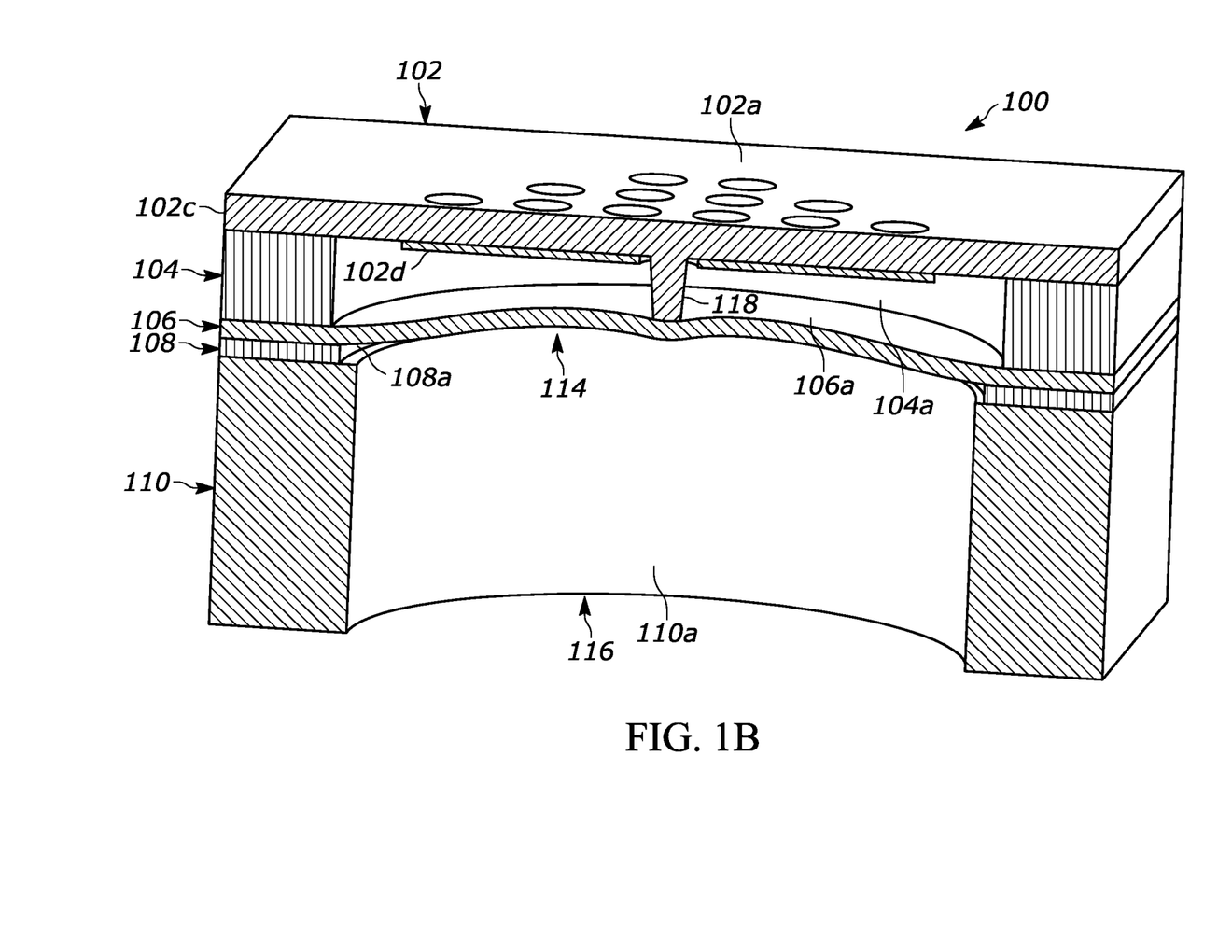
FIG. 1B is perspective cross-sectional view of the MEMS device of FIG. 1A, with the diaphragm in a deflected state.

Turning to FIG. 1A and FIG. 1B, a MEMS device according to an embodiment is shown. The MEMS device, generally labelled 100, includes a backplate 102, a first spacer 104, a diaphragm 106, a second spacer 108, and a substrate 110. The diaphragm 106 and the backplate 102 can be any shape. The first spacer 104, the second spacer 108, and the substrate 110 may all be part of a single unitary body. The diaphragm 106, in an embodiment, is made of polycrystalline silicon ("poly-silicon"). The diaphragm 106, in FIG. 1A is shown flat for ease of reference. However, it is to be understood that because the diaphragm 106 has a net compressive stress it will most likely be bowed (e.g., bowed up or bowed down) when the MEMS device 100 is in an unbiased state (i.e., with no electrical charge being applied to the diaphragm 106 and the backplate 102).

The backplate 102 has a first surface 102a, which is part of an insulating or dielectric layer, and a second surface 102b, which is part of a conductive layer (a first electrode), opposite the first surface 102a. The diaphragm 106 (which has or is a second electrode) has a first surface 106a and a second surface 106b opposite the first surface 106a. The diaphragm 106 is sandwiched between and constrained by the first spacer 104 (which is in contact with the first surface 106a) and the second spacer 108 (which is in contact with the second surface 106b). The first spacer 104 has a curved interior wall 104a. The second surface 102b of the backplate 102, the first surface 106a of the diaphragm 106, and the interior wall 104a of the first spacer 104 define a chamber 112.

The second spacer 108 has a curved interior wall 108a. The diaphragm 106 is fully constrained (by the first spacer 104 and the second spacer 108) along a boundary that is defined by a curve along which the interior wall 104a of the first spacer 104 meets the diaphragm 106. The substrate 110 also has a curved interior wall 110a, which defines a hole 116 that extends through the substrate 110.

In an embodiment, the first and second spacers 104 and 108 are part of the sacrificial material of the MEMS device 100, and the walls 104a and 108a of the spacers are made from a time-limited etch front of the sacrificial material.

There are many possible implementations of the backplate 102 and the diaphragm 106. For example, the backplate 102 may include a dielectric layer and a conductive layer that is deposited onto or otherwise connected to the dielectric layer. The diaphragm 106 may be made entirely from a conductive layer. In other implementations, the diaphragm 106 includes both an insulating layer and a conductive layer, similar to the back plate 102. In yet other implementations, the diaphragm 106 includes both a conductive layer and an insulating layer, and the back plate 102 is formed entirely from a conductive layer. The conductive layers of the backplate 102 and the diaphragm 106 may be facing one another without any materials therebetween or may be separated from one another by an insulating layer of the diaphragm 106 and/or backplate 102. The insulating layers of the backplate 102 and the diaphragm 106 may be made from silicon nitride or other suitable insulating material. The conductive layers on the backplate 102 and/or the diaphragm 106 may be made from a polycrystalline silicon, a metal, or other suitable conductor.

During operation of the MEMS device 100, electric charge is applied to the conductive layer of the backplate 102 and to the conductive layer of the diaphragm 106, thereby inducing an electric field between the backplate 102 and the diaphragm 106 and creating an electrostatic bias on the diaphragm 106. Movement of the air (e.g., resulting from sound waves) pushes against the second surface 106b of the diaphragm 106 causing the diaphragm 106 to deflect (enter a deflection state) and to deform. This deformation causes a change in the capacitance between the backplate 102 and the diaphragm 106, which can be detected and interpreted as sound.

In an embodiment, the diaphragm 106 has a net compressive stress when in an unbiased state and in the absence of an electric field. In order to fabricate the MEMS device 100 so that the diaphragm 106 has a net compressive stress, a manufacturer deposits and (if appropriate) anneals the film of the diaphragm so that the net stress in the diaphragm when the entire structure is completed is compressive.

According to an embodiment, the electric charge applied to the backplate 102 and to the diaphragm 106 is such that the resulting electrostatic bias on the diaphragm is larger than the expected peak acoustic pressure on the diaphragm. This helps to keep the diaphragm 106 from buckling.

In an embodiment, the stress gradient on the diaphragm 106 is such that the diaphragm 106 bows up (i.e., with a concave surface facing away from the backplate 102) when the MEMS device 100 is in an unbiased state. This helps to prevent very large movements in the diaphragm 106 when the MEMS device 100 is powered up.

According to an embodiment, the backplate 102 includes a post 118 extending from the second surface 102b. The post 118 serves to limit the maximum deflection of the diaphragm 106. As such, the tip of the post 118 is disposed at a distance from the first surface 106a of the diaphragm 106 sufficient to substantially limit the deflection of the diaphragm 106.

Because of the presence of the post 118, the diaphragm 106 deforms into an 'M' shape, as shown in FIG. 1B.

In an embodiment, the post 118 is disposed at or near an unconstrained maximum deflection point of the diaphragm 106 so as to limit an actual maximum deflection of the diaphragm 106 during operation of the MEMS device 100. The center deflection (deflection at the center of the diaphragm 106) can be between 10-90% of the total gap (the gap between the backplate 102 and the diaphragm 106), but it is optimally in the 10-20% range, which controls the maximum deflection to the greatest degree without presenting a high risk of the diaphragm 106 sticking to the post 118.

Figure 1C:
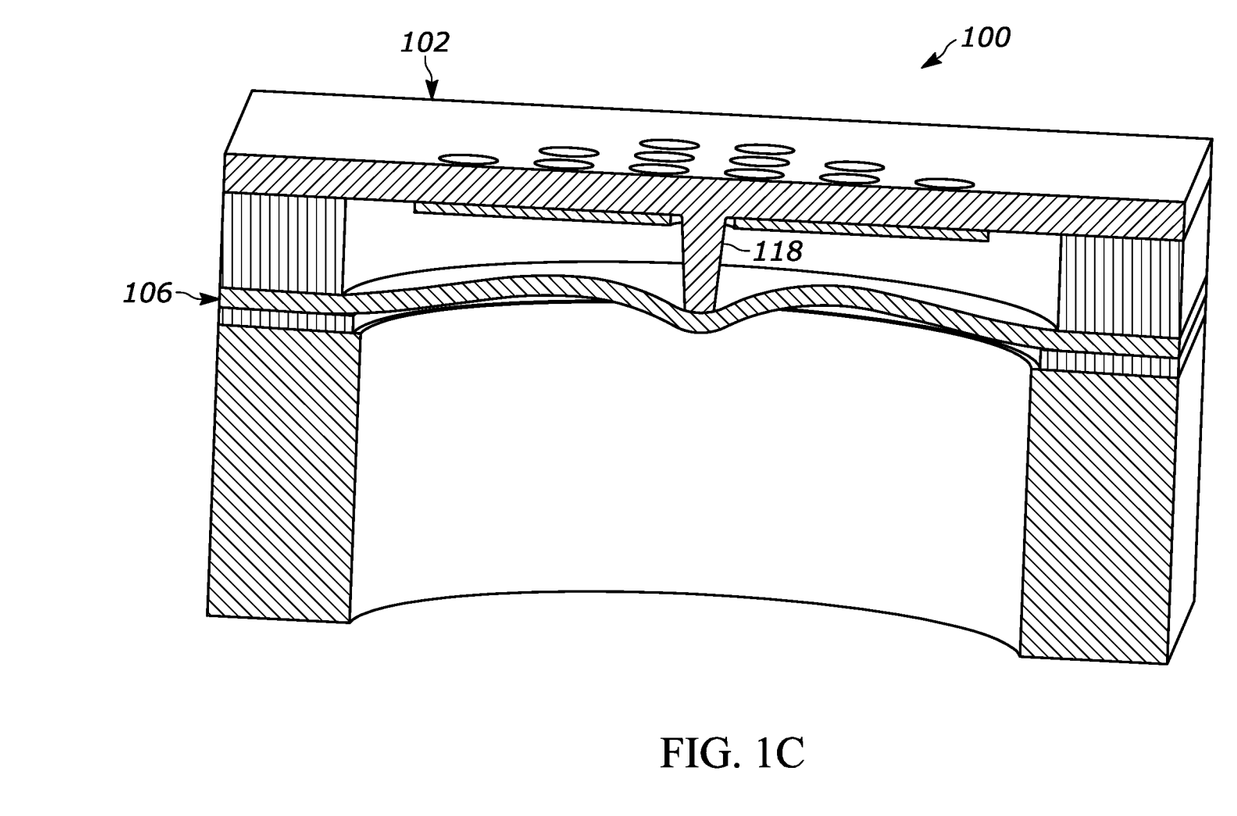
FIG. 1C is perspective cross-sectional view of an alternative embodiment of the MEMS device of FIG. 1A, with the diaphragm in a deflected state.

Turning to FIG. 1C, in an embodiment, the post 118 spans the gap between the backplate 102 and the diaphragm 106 and is attached to the diaphragm 106. In this case, there would obviously be no gap between the post 118 and the diaphragm 106.

According to an embodiment the post 118 is located at or near the centroid of the diaphragm 106 and the backplate 102. In some embodiments, the post 118 is part of the diaphragm 106 instead of the backplate 102, and extends towards the backplate 102. In such an embodiment, the post 118 would serve the same function as it would if attached to the backplate 102.

Figure 2A:
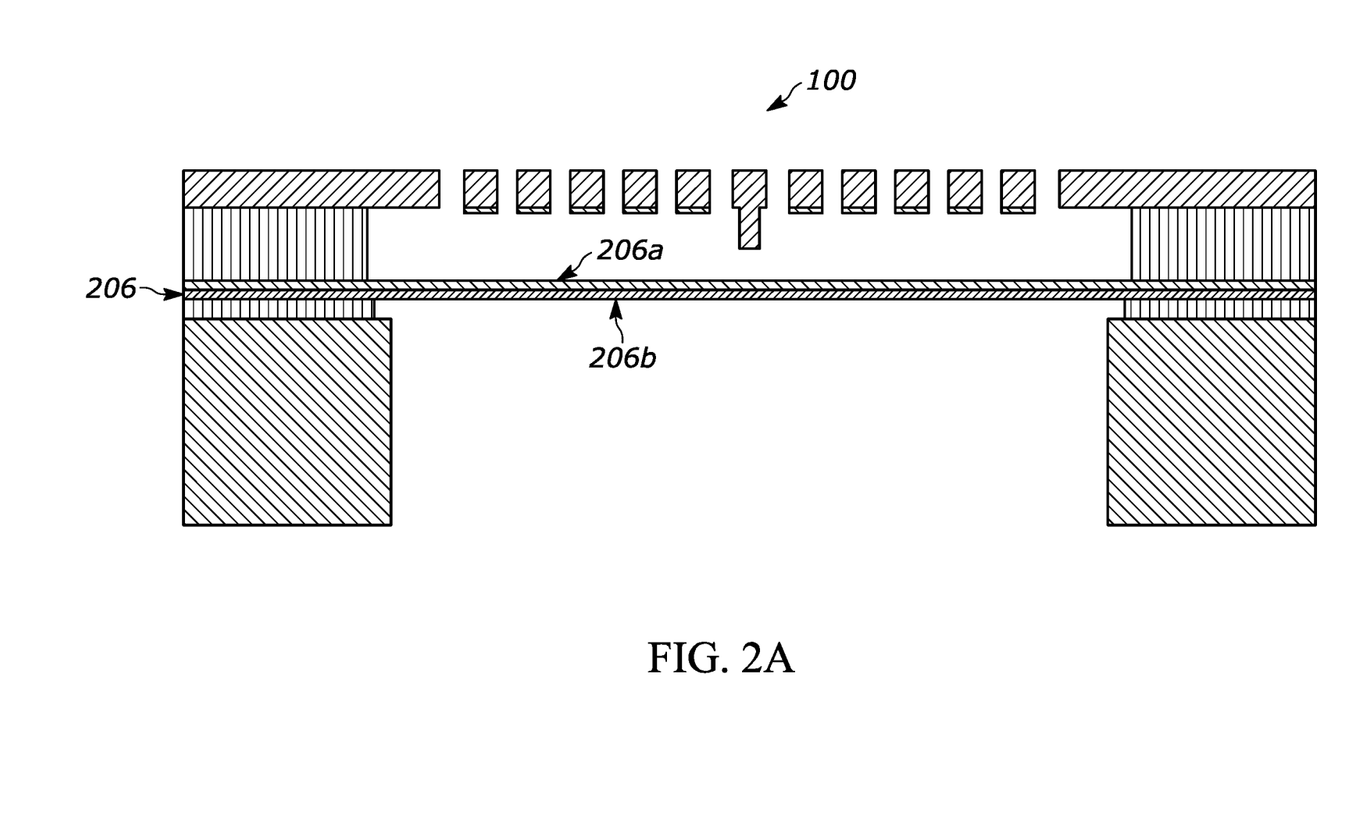
FIG. 2A is a side cross-sectional view of a MEMS device according to another embodiment.

Turning to FIG. 2A, another embodiment of the MEMS device 100 is shown. In this embodiment, the diaphragm 206 is made up of a first layer 206a and second layer 206b, one of which is tensile layer (e.g., a nitride film) and one of which is a compressive layer (e.g., poly-silicon). In one implementation, the first layer 206a is tensile and the second layer 206b is compressive. In another implementation, the first layer 206a is compressive and the second layer 206b is tensile. In both implementations, the diaphragm 206 as a whole is net compressive.

Figure 2B:
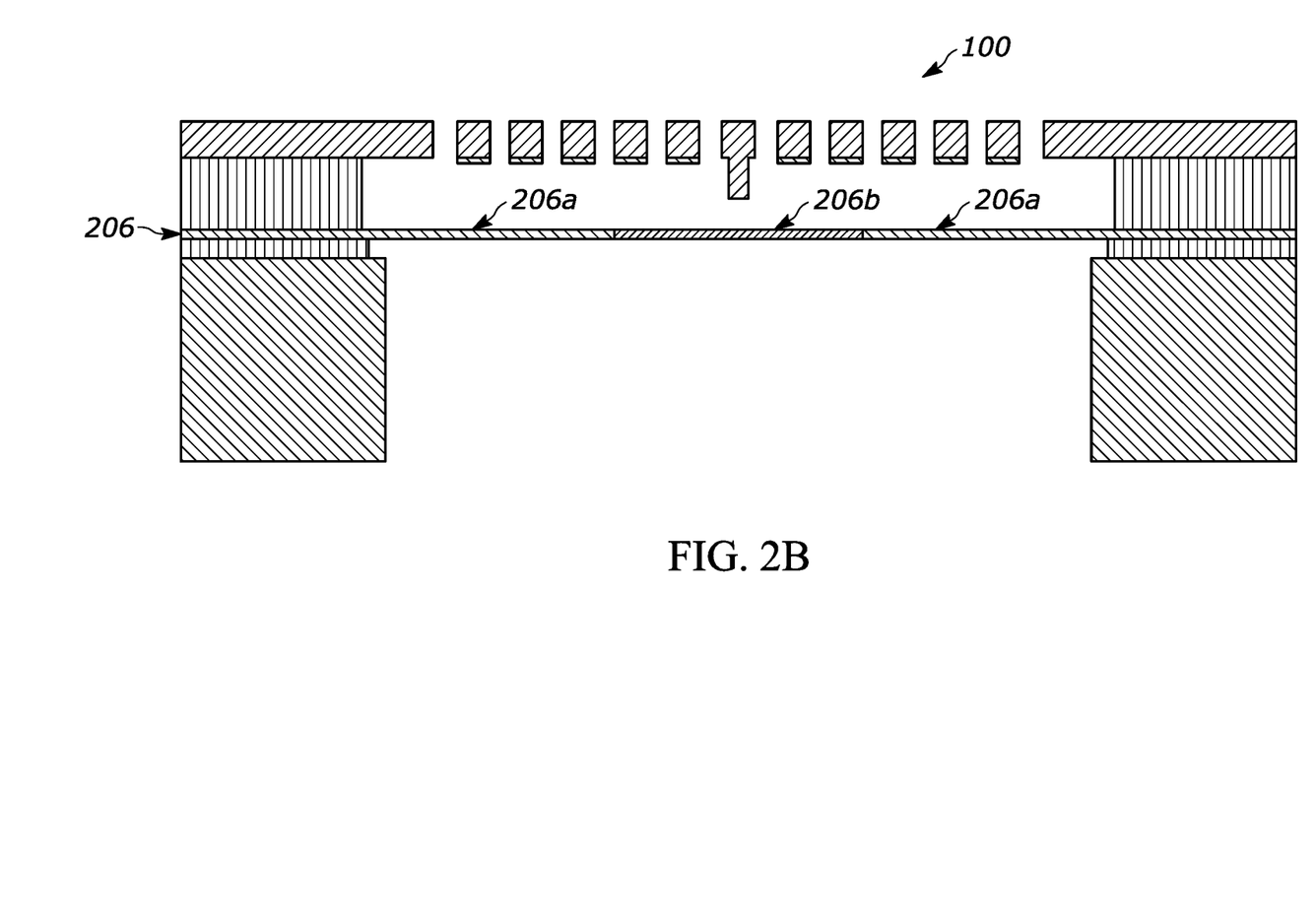
FIG. 2B is a side cross-sectional view of a MEMS device according to still another embodiment.

Turning to FIG. 2B, still another embodiment of the MEMS device 100 is shown. In this embodiment, the diaphragm 206 is made up of a ring-shaped outer piece 206a and a disc-shaped inner piece 206b, in which one piece is tensile (e.g., a nitride film) and the other piece is compressive (e.g., poly-silicon). In one implementation, the outer piece 206a is tensile and the inner piece 206b is compressive. In another implementation, the outer piece 206a is compressive and the inner piece 206b is tensile. In both implementations, the diaphragm 206 as a whole is net compressive.

Figure 3:
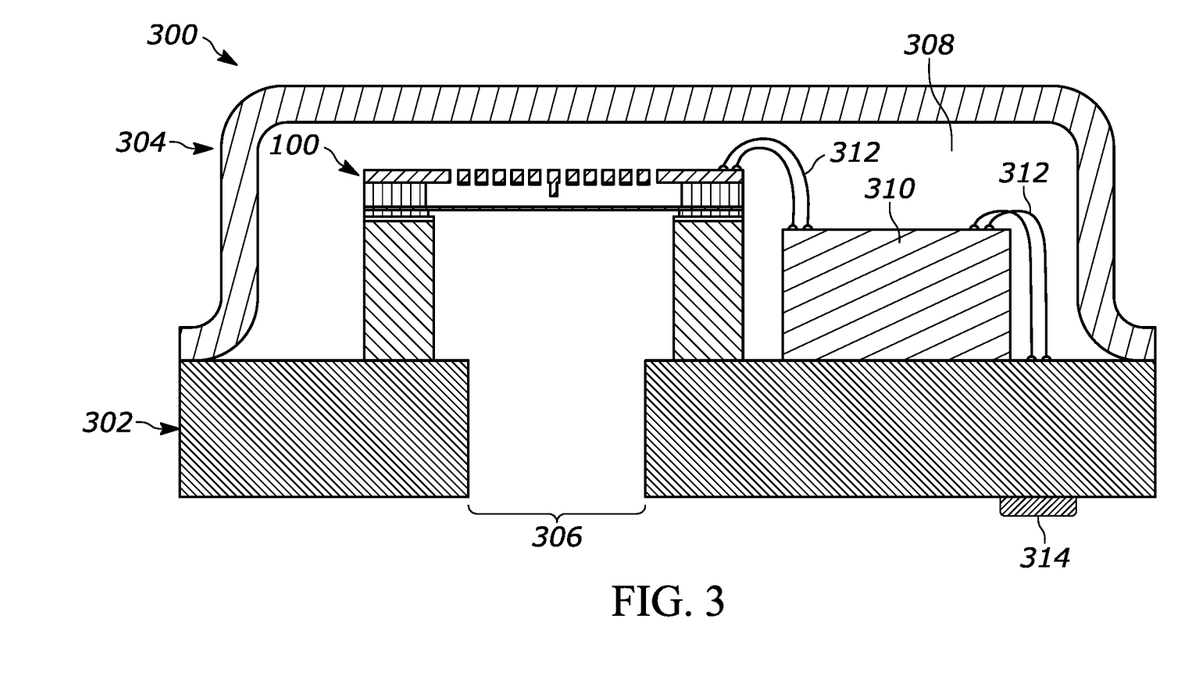
FIG. 3 is a side cross-sectional view of a microphone assembly according to an embodiment.

Turning to FIG. 3, the MEMS device is configured to fit within a microphone assembly, generally labeled 300. The assembly 300 includes a housing including a base 302, a cover 304 (e.g., a housing lid), and an acoustic port 306. In one implementation, the base 302 is a printed circuit board. The cover 304 is coupled to the base 302 (e.g., the cover 304 may be mounted onto a peripheral edge of the base 302). Together, the cover 304 and the base 302 form an enclosed volume 308 for the assembly 300. As shown in FIG. 3, the acoustic port 306 is disposed on the base 302 and is structured to convey sound waves to the MEMS device 100 located within the enclosed volume 308. In other implementations, the acoustic port 306 is disposed on the cover 304 and/or a side wall of the cover 304. In some embodiments, the assembly 300 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 300 includes an electrical circuit disposed in the enclosed volume 308. The electrical circuit includes an integrated circuit (IC) 310. The IC 310 may be an application specific integrated circuit (ASIC). Alternatively, the IC 310 may include a semiconductor die integrating various analog, analog-to-digital, and/or digital circuits.

In the assembly 300 of FIG. 3, the MEMS device 100 is a MEMS acoustic transducer that converts sound waves, received through acoustic port 306, into a corresponding electrical microphone signal. The transducer generates an electrical signal (e.g., a voltage) at a transducer output in response to acoustic activity incident on the port 306. As shown in FIG. 3, the transducer output includes a pad or terminal of transducer that is electrically connected to the electrical circuit via one or more bonding wires 312. The assembly 300 of FIG. 3 further includes electrical contacts, shown schematically as contacts 314, typically disposed on a bottom surface of the base 302. The contacts 314 are electrically coupled to the electrical circuit. The contacts 314 are configured to electrically connect the assembly 300 to one of a variety of host devices.

Figure 4A:
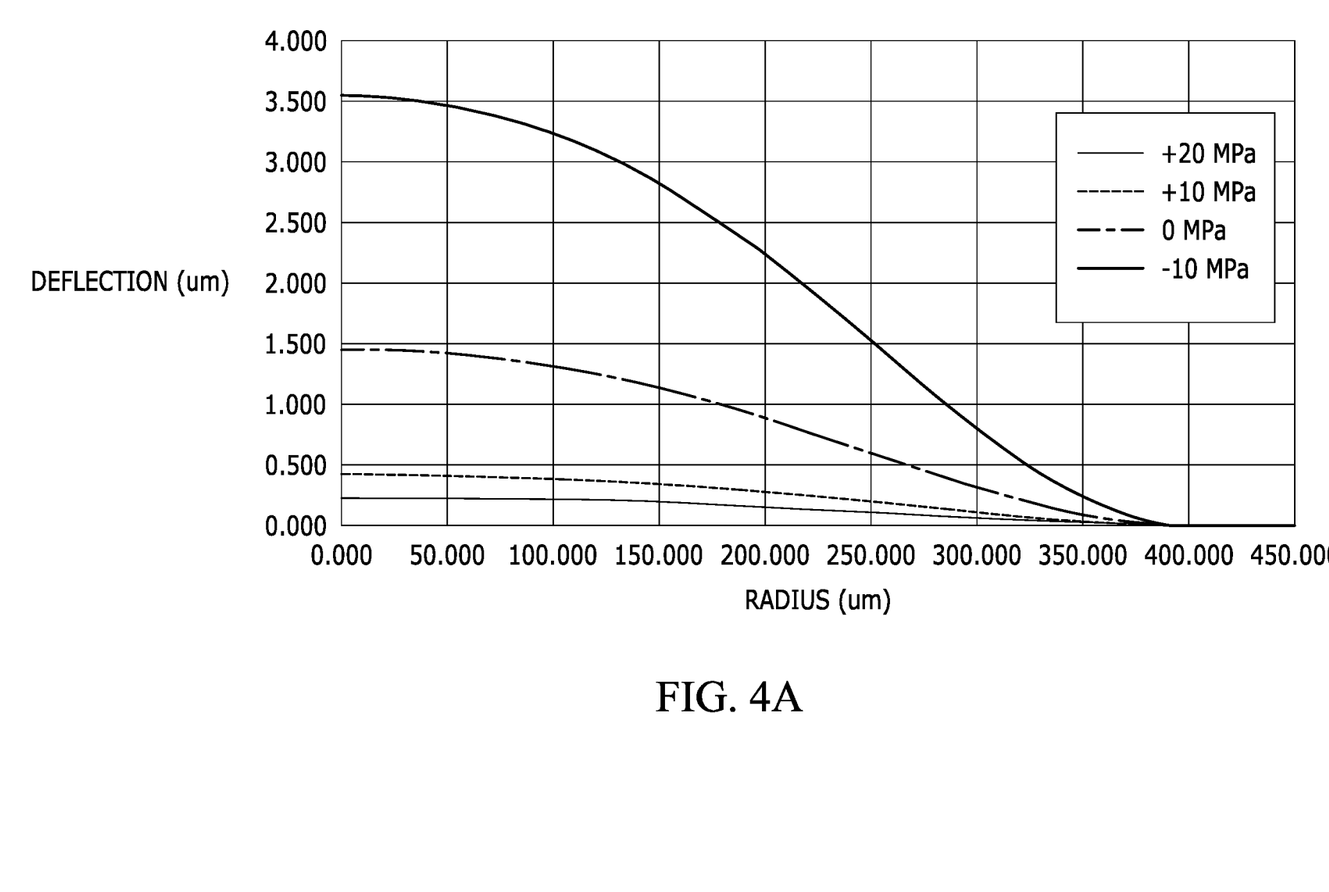
FIG. 4A depicts a graph of the intrinsic stress over different deflections at different distances from the center of a diaphragm configured according to an embodiment.

FIG. 4A depicts a graph of the deflection of a diaphragm versus radial distance from the center. This graph includes various net stress values and with the diaphragm under electrostatic bias. The diaphragm is configured without a center post to constrain the maximum deflection. Note that for a net compressive stress of 10 MPa (negative values are compressive) the maximum diaphragm bow is just over 3.5 microns ($\mu$m).

Figure 4B:
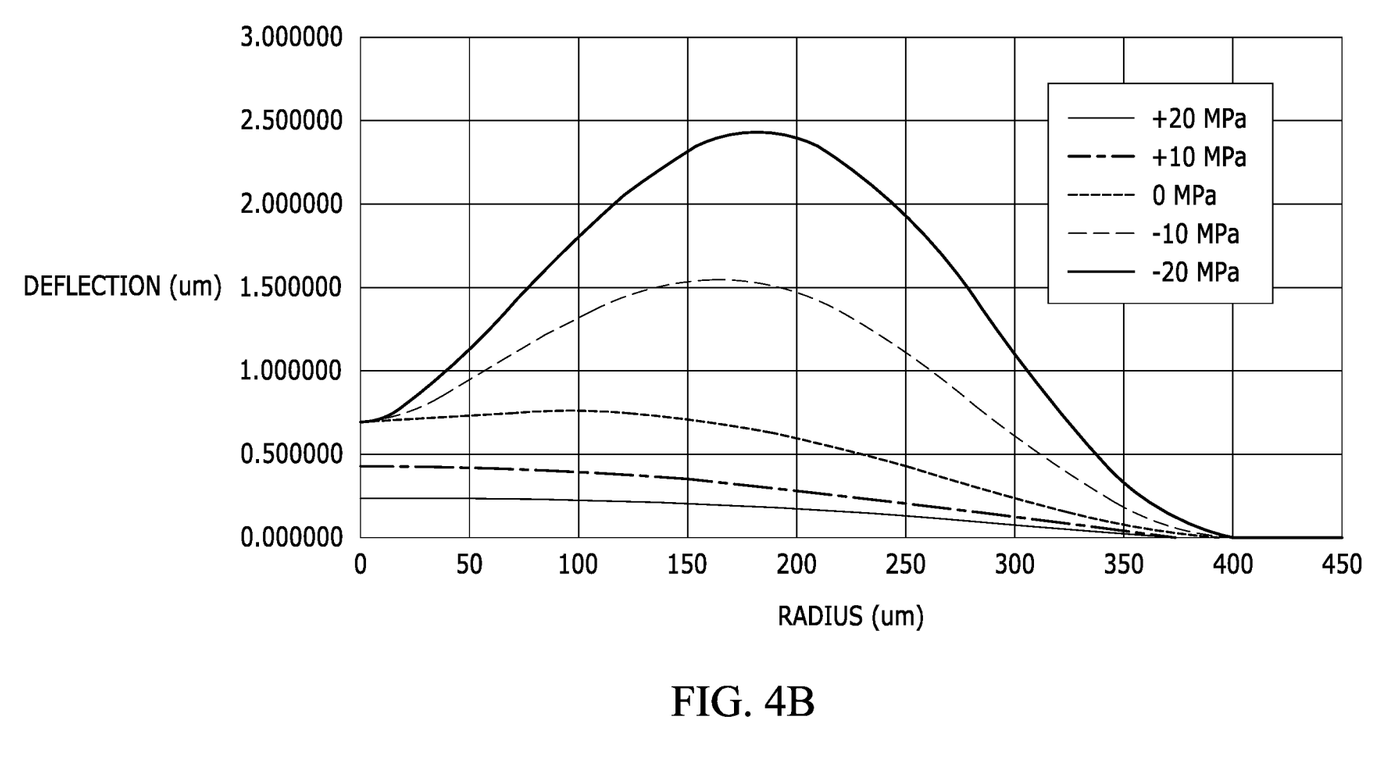
FIG. 4B depicts a graph of the intrinsic stress over different deflections at different distances from the center of a diaphragm configured according to an embodiment, in which the backplate has a post at its center.

FIG. 4B depicts a graph similar to that of FIG. 4A but with a diaphragm configured according to an embodiment, in which the backplate has a post at its center (such as the embodiments depicted in FIG. 1A and FIG. 1B) in order to limit the deflection at the center. Note that the maximum deflection in this diaphragm is less than 2.5 $\mu$m, as opposed to more than 3.5 $\mu$m for the diaphragm without a center post of FIG. 4A.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A micro-electromechanical system (MEMS) device comprising:
   a constrained diaphragm comprising a surface, the diaphragm having a net compressive stress; and
   a backplate comprising
      a surface facing the surface of the diaphragm, the surface of the backplate having a center;
      a post extending from the surface of the backplate, wherein the post is located at or near the center, wherein the post limits a maximum deflection of the diaphragm.

2. The MEMS device of claim 1, wherein the diaphragm is attached to the post.

3. The MEMS device of claim 1, wherein the diaphragm comprises a plurality of film layers each having a stress, the combination of the films yielding a net compressive stress for the diaphragm.

4. The MEMS device of claim 1, wherein the diaphragm comprises:
   a tensile silicon nitride layer; and
   a compressive polycrystalline silicon layer.

5. A micro-electromechanical system (MEMS) device comprising:
   a constrained diaphragm comprising a surface, wherein the diaphragm has a net compressive stress; and
   a backplate comprising
      a surface facing the surface of the diaphragm,
      a post extending from the surface of the backplate, wherein the post is disposed at or near an unconstrained maximum deflection point of the diaphragm so as to limit an actual maximum deflection of the diaphragm during operation of the MEMS device.

6. The MEMS device of claim 5, wherein the diaphragm is attached to the post.

7. The MEMS device of claim 5, wherein the diaphragm comprises a plurality of film layers.

8. The MEMS device of claim 7, wherein the plurality of film layers comprises a film layer that has a tensile stress.

9. The MEMS device of claim 7, wherein the plurality of film layers comprises a film layer that has a compressive stress.

10. The MEMS device of claim 5, wherein the diaphragm comprises:
    a tensile silicon nitride layer; and
    a compressive polycrystalline silicon layer.

11. A microphone comprising:
    a micro-electromechanical system (MEMS) device comprising:
       a constrained diaphragm comprising a surface, wherein the diaphragm has a net compressive stress; and
       a backplate comprising
          a surface facing the surface of the diaphragm,
          a post extending from the surface of the backplate, wherein the post is disposed at or near a centroid of the diaphragm and the backplate; and
    an integrated circuit electrically connected to the MEMS device.

12. The microphone of claim 11, further comprising a housing comprising a base and a cover attached to the base, wherein the housing encloses the MEMS device and the integrated circuit.

13. The microphone of claim 12, wherein an acoustic port is defined in the cover of the housing.

14. The microphone of claim 12, wherein an acoustic port is defined in the base of the housing.

* * * * *